US007476938B2

(12) United States Patent
Chidambarrao et al.

(10) Patent No.: US 7,476,938 B2
(45) Date of Patent: \*Jan. 13, 2009

(54) TRANSISTOR HAVING DIELECTRIC STRESSOR ELEMENTS AT DIFFERENT DEPTHS FROM A SEMICONDUCTOR SURFACE FOR APPLYING SHEAR STRESS

(75) Inventors: Dureseti Chidambarrao, Weston, CT (US); Brian J. Greene, Yorktown Heights, NY (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 346 days.

This patent is subject to a terminal disclaimer.

(21) Appl. No.: 11/164,373

(22) Filed: Nov. 21, 2005

(65) Prior Publication Data
US 2007/0114632 A1    May 24, 2007

(51) Int. Cl.
*H01L 29/00* (2006.01)
(52) U.S. Cl. .................. 257/347; 257/414; 257/510; 257/E29.02
(58) Field of Classification Search .......... 257/347, 257/350, 510, 414, 200, E21.415, E31.013, 257/E29.02, E29.266, E21.633, E21.642
See application file for complete search history.

(56) References Cited

U.S. PATENT DOCUMENTS 6,717,216 B1   4/2004  Doris et al.
6,884,667 B1   4/2005  Doris et al.
7,221,024 B1 * 5/2007  Chidambarrao et al. ..... 257/347
2004/0113174 A1  6/2004  Chidambarrao et al.
2005/0067294 A1  3/2005  Choe et al.

OTHER PUBLICATIONS

Title: Optical Properties of Porous Silicon Author: W. Theiß I. Physikalisches Institut, Aachen University of Technology (RWTH)—D-52056 Aachen, Germany Surface Science Reports vol. 29 (1997) pp. 91-192.

\* cited by examiner

*Primary Examiner*—Thomas L Dickey
*Assistant Examiner*—Fazli Erdem
(74) *Attorney, Agent, or Firm*—Daryl Neff; H. Daniel Schnurmann

(57) ABSTRACT

A chip is provided which includes an active semiconductor region and a field effect transistor ("FET") having a channel region, a source region and a drain region all disposed within the active semiconductor region. The FET has a longitudinal direction in a direction of a length of the channel region, and a transverse direction in a direction of a width of the channel region. A buried dielectric stressor element has a horizontally extending upper surface at a first depth below a major surface of a portion of the active semiconductor region, such as an east portion of the active semiconductor region. A surface dielectric stressor element is disposed laterally adjacent to the active semiconductor region at the major surface of the active semiconductor region. The surface dielectric stressor element extends from the major surface to a second depth not substantially greater than the first depth. The stresses applied by the buried and surface dielectric stressor elements cooperate together to apply a shear stress to the channel region of the FET.

10 Claims, 7 Drawing Sheets

TRANSISTOR HAVING DIELECTRIC STRESSOR ELEMENTS AT DIFFERENT DEPTHS FROM A SEMICONDUCTOR SURFACE FOR APPLYING SHEAR STRESS

BACKGROUND OF THE INVENTION

The present invention relates to semiconductor devices and processing. More particularly, the invention relates to semiconductor devices with dielectric stressor elements and methods of making the same.

A compressive stress or tensile stress can be applied to some types of transistors to increase their performance. In particular, the performance of a p-type field effect transistor ("PFET") improves when a longitudinal (in the direction of current flow) compressive stress is applied to the channel region. On the other hand, the performance of an n-type field effect transistor ("NFET") improves when a longitudinal tensile stress is applied to the channel region.

Various structures have been proposed for imparting a compressive stress or tensile stress to such transistors. In some cases, it has been proposed to provide one or more stressor elements in proximity with an NFET or PFET for applying a beneficial stress to the transistor. For example, commonly assigned U.S. Patent Publication No. 2004/0113174 describes a way of embedding dielectric stressor elements in isolation regions at exterior edges of an active semiconductor region which houses an NFET or a PFET. In such case, the dielectric stressor element and the isolation region are merged. While enabling efficiencies, these isolation-stressor elements require that a design point be reached in which potentially conflicting requirements for the stress-applying function, the isolation function and the processing needed to fabricate them are all simultaneously satisfied.

Thus, according to the known art, dielectric stressor elements used for applying stresses to an NFET or PFET are constrained to the locations at which isolation regions are placed. To overcome this constraint, it is clear that further improved structures and processing are awaited.

SUMMARY OF THE INVENTION

The structures and methods provided according to embodiments of the invention herein allow the locations of dielectric stressor elements used with a PFET or an NFET, e.g., the placement, dimensions, edges, etc., of such stressor element, to not be constrained to locations of isolation regions used to isolate the PFET or NFET. Thus, according to one embodiment of the invention, a stress is applied to a channel region of the FET by a "buried" dielectric stressor element. By similar processing, other dielectric stressor elements in accordance with an embodiment of the invention are surface elements provided at a major surface of an active semiconductor region. Preferably, these surface dielectric stressor elements function as combined isolation-stressor elements in locations where isolation regions would ordinarily be provided.

In accordance with embodiments of the invention, a shear stress is applied to the channel region of the FET by a combination of buried and surface dielectric stressor elements. Thus, in accordance with an embodiment of the invention, on one side of an FET, for example, on a side of the FET on which a source region is disposed, a buried dielectric stressor element extends horizontally under a portion of the active semiconductor region, the dielectric stressor element having an upper surface which underlies the active semiconductor region. An edge of the buried dielectric stressor element that is shared with the active semiconductor region extends in a direction away from the upper surface. According to a preferred embodiment of the invention, such edge can be made closer to the channel region of the PFET or NFET than the edge of a trench isolation region could be located. In addition thereto, a surface dielectric stressor element is provided at a major surface of the active semiconductor region on another side of the FET, that is, on a side preferably opposite the side on which the buried dielectric stressor element is disposed. In combination, the buried dielectric stressor element and the surface dielectric stressor element apply stresses in opposite directions to the channel region of the FET to apply a shear stress thereto.

DETAILED DESCRIPTION

New ways of applying a compressive stress and/or a tensile stress to the channel region of a PFET or an NFET transistor are provided according to the embodiments of the present invention that offer simple processing and which are integratable into present methods of manufacturing PFET and NFET transistors of integrated circuits or "chips". According to the various embodiments of the invention described herein, FETs are provided in various forms in which at least one buried dielectric stressor element underlying one portion of the active semiconductor region exerts a stress upon the channel region of the FET in a first direction and in which at least one surface dielectric stressor element provided at a surface of the active semiconductor region exerts a stress upon the channel region in a second direction opposite to the first direction.

Figure 1A:
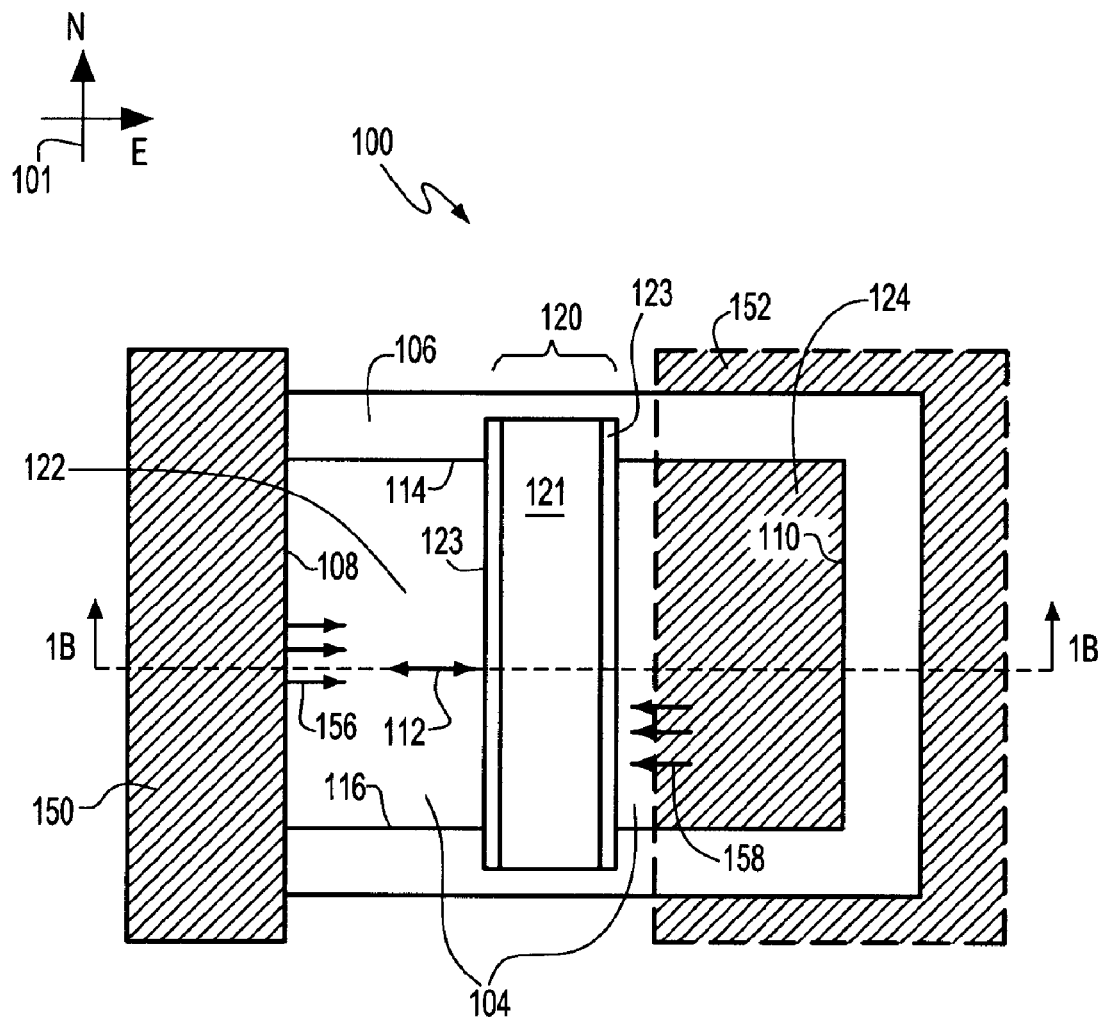
FIG. 1A is a face-up plan view of an FET in accordance with an embodiment of the invention.

FIG. 1A is a face-up plan view illustrating a PFET 100 in accordance with an embodiment of the invention, in which a surface dielectric stressor region 150 applies a compressive stress in a first direction 156 to a channel region (not visible in FIG. 1A) of the PFET and a buried dielectric stressor region 152 applies a compressive stress in a second, opposite, direction to the channel region of the PFET. As illustrated in FIG. 1A, an active semiconductor region 104 of the PFET is bounded partially by an isolation region 106, the isolation region being, illustratively, a shallow trench isolation ("STI") region. The STI region 106 thus defines the boundaries or "edges" of the active semiconductor region 104.

In describing PFET 100, it is helpful to provide a frame of reference in relation to which the elements of the PFET and the buried dielectric stressor elements are located. The directions of a compass: i.e., north, south, east and west provide a useful frame of reference for describing the PFET. These directions are indicated by the legend 101. These directions need not coincide with the true north, south, east and west directions, since the PFET 100 can operate in any orientation, at any angle towards the true north direction. Rather, the directions indicated by the legend 101 are useful in describing the placement and orientation of various elements of the PFET 100 in relation to each other.

As defined by STI region 106, the edges of the active semiconductor region 104 include a west edge 108 and an east edge 110 which is opposite the west edge in the longitudinal (east-west) direction 112 of the PFET. The STI region 106 further defines a north edge 114 and a south edge 116 of the active semiconductor region 104 which is opposite from the north edge in a transverse direction 118 of the PFET. As further shown in FIG. 1A, a gate 120 including a gate conductor 121 and dielectric sidewalls or spacers 123 overlies the active semiconductor region between a source region 122 and a drain region 124. In the PFET shown in FIG. 1A, the first and second dielectric stressor elements 150, 152 apply compressive stresses to the active semiconductor region 104. Specifically, a first dielectric stressor element 150 which is present at the top (major) surface of the active semiconductor region has an inner edge which defines the west edge 108 of the active semiconductor region 104. The second (buried) dielectric stressor element 152 is disposed at a predetermined depth from the major surface of the active semiconductor region. The second dielectric stressor element 152 underlies a portion of the active semiconductor region 104 at the east edge 110.

The compressive dielectric stressor elements shown in FIG. 1A are preferably in form of regions of "expanded oxide," i.e., regions of oxide which have expanded at least slightly from the volume formerly occupied by semiconductor material of the semiconductor substrate. The first and second dielectric stressor elements apply stresses to the channel region of the PFET in opposite directions, as indicated by the arrows 156 and 158. The effect of these dielectric stressor elements is to apply oppositely directed stresses to the channel region of the PFET at opposite (west and east) edges 108, 110 of the active semiconductor region and at different depths from the major surface, such that a shear stress is applied to the channel region.

Figure 1B:
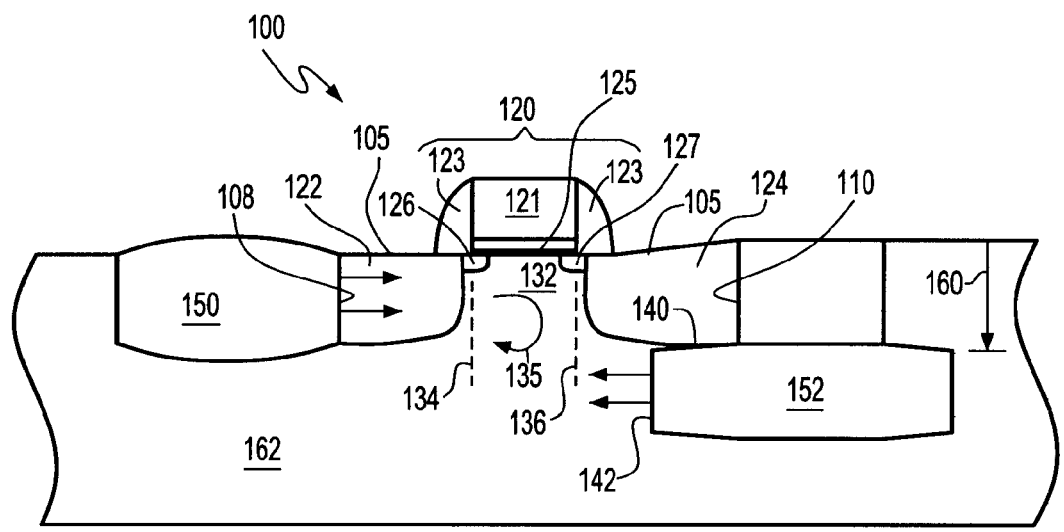
FIG. 1B is a sectional view along line 1B-1B of the FET shown in FIG. 1A.

FIG. 1B is a sectional view of PFET 100 through lines 1B-1B of FIG. 1A. As illustrated therein, the active semiconductor region 104 is provided in a bulk semiconductor substrate 162, preferably being a silicon substrate. A face of the active semiconductor region 104 defines a major surface 105 of the semiconductor substrate. The gate 120, including a gate conductor 121 and spacers 123, overlies a channel region 132 of the PFET, as spaced therefrom by a gate dielectric 125. Edges of the channel region 132 are determined by the locations in the longitudinal direction of a first edge 134 of the gate conductor and a second gate edge 136 opposite thereto. The source region 122 including an optional extension and/or halo region 126 extends from the vicinity of the first gate edge 134 to the west edge 108 of the active semiconductor region at STI region 106. The drain region 124 including an optional extension and/or halo region 127 extends from the vicinity of a second edge 136 of the channel region to the east edge 110 of the active semiconductor region at STI region 106.

As described above, the first dielectric stressor element 150 has a top surface at the major surface 105 and extends downward therefrom. The first dielectric stressor element has an inner edge which defines the west edge of the active semiconductor region at which a source region 122 of the PFET is disposed.

The second dielectric stressor element 152 has an upper surface 140 which is disposed at a first depth 160 from the major surface 105 of the semiconductor substrate. As seen in FIG. 1B, the upper surface of the second (buried) stressor element lies below a thickness of the active semiconductor region, as extends downward from the major surface to the first depth. The second dielectric stressor element underlies a portion of the active semiconductor region in which the drain region 124 is disposed. This contrasts with the first dielectric stressor element which is disposed at the major surface. Specifically, the first dielectric stressor element 150 extends from the major surface to a depth below the major surface, such depth being not substantially greater than the thickness of the active semiconductor region. In order to achieve a desirable stress in a shear direction, the maximum depth of the first dielectric stressor element should not be substantially greater than the first depth 160. Preferably, the maximum depth of the first dielectric stressor element is the same as or somewhat less than the first depth.

The second dielectric stressor element does not underlie the entirety of the active semiconductor region, but rather, the first dielectric stressor region shares an edge 142 with the active semiconductor region. The edge extends in a direction downward away from the generally horizontal upper surface 140. Preferably, the edge 142 of the dielectric stressor element is located at about one half a distance between the edge 110 of the active semiconductor region and the closest edge (i.e., the second gate edge 136) of the gate conductor 121, such edge 136 being indicated by the dashed line. As discussed above, the effect of the first and second dielectric stressor elements is to apply oppositely directed stresses to the channel region of the PFET at opposite (west and east) edges 108, 110 of the active semiconductor region and at different depths from the major surface, such that a shear stress is applied to the channel region.

Figure 1C:
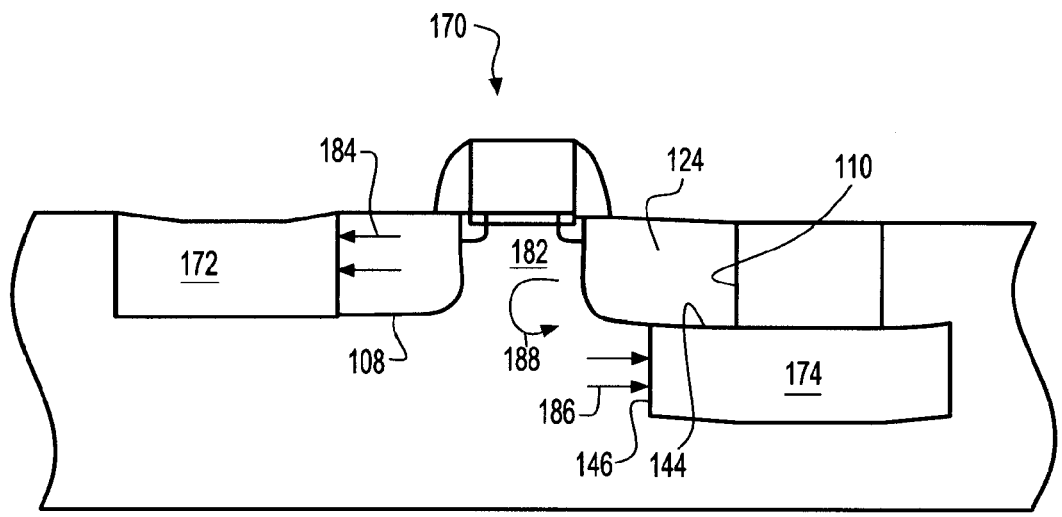
FIG. 1C is a sectional view along line 1B-1B of a variation of the FET shown in FIG. 1A.

FIG. 1C depicts a variation of the embodiment described above with respect to FIGS. 1A-1B in which an NFET 170 is provided, for which a pair of tensile stressor elements 172, 174 are disposed at a west edge 108 and an east edge 110 of an active semiconductor region. Here, FIG. 1A serves again as a corresponding top-down plan view of the NFET and FIG. 1C is a sectional view of NFET 170 through lines 1B-1B of FIG. 1A. Unlike the compressive dielectric stressor elements illustrated in FIG. 1B, the tensile dielectric stressor elements shown in FIG. 1C are preferably in form of regions of "collapsed oxide," i.e., regions of oxide which have shrunken at least slightly from the volume formerly occupied by semiconductor material of the semiconductor substrate. The structures shown in FIG. 1C are the same as those described above with respect to FIGS. 1A-1B, except for the type of transistor (NFET rather than PFET), the dopant types used in each of the respective source regions, drain regions and the channel region in the NFET and the type of stress (tensile) rather than compressive which is applied by each dielectric stressor element 172, 174. Thus, as shown in FIG. 1C, a buried tensile dielectric stressor element 174, having both a top surface 144 and an edge 146 in contact with the active semiconductor region, applies a tensile stress in a first direction 186 to the active semiconductor region. On the other hand, a surface tensile dielectric stressor element 172 applies a tensile stress in a second direction 184 to the active semiconductor region. The stresses applied by the two dielectric stressor elements combine to apply a shear stress to the channel region 182 of the NFET which has a tendency to "twist" the channel region 182 in a direction as shown by arrow 188.

The PFET depicted in FIGS. 1A, 1B is described above as utilizing compressive stressor elements and the NFET depicted in FIGS. 1A, 1C is described as utilizing tensile stressor elements. However, it is not required that a PFET utilize only compressive stressor elements or that an NFET utilize only tensile stressor elements. In alternative embodiments, it is also possible to provide tensile stressor elements for a PFET at locations corresponding to those described above with respect to FIG. 1C and it is possible to provide compressive stressor elements for an NFET at locations corresponding to those described above with respect to FIG. 1B. While it is to be expected that performance of the individual PFET having tensile stressor elements will not be as great as an individual PFET which has compressive stressor elements, overall performance can still benefit when both PFETs and NFETs of a chip have tensile stressor elements in relation to a chip which lacks such stressor elements.

Overall performance of a chip can still benefit when both PFETs and NFETs of a chip have compressive stressor elements or when both PFETs and NFETs of a chip have tensile stressor elements. The beneficial effect of the shear stresses applied to the FET may overcome or at least mitigate the effect of somewhat compressive stress being applied to an NFET or somewhat tensile stress being applied to a PFET. Indeed, such arrangement in which PFETs and NFETs both have the same type of stressor elements can be of advantage for some applications, because it requires less processing steps to manufacture than one in which both tensile and compressive-type stressor elements are provided. Particularly in complementary metal oxide semiconductor ("CMOS") chips, it may be expedient to provide only one type of (tensile or compressive) stressed element in a particular chip. In such case, a net benefit derived from the shear stress applied to either the PFET or NFET may justify the less preferred compressive type of stress being applied to the NFET or the less preferred tensile type of stress being applied to the PFET.

Figure 2:
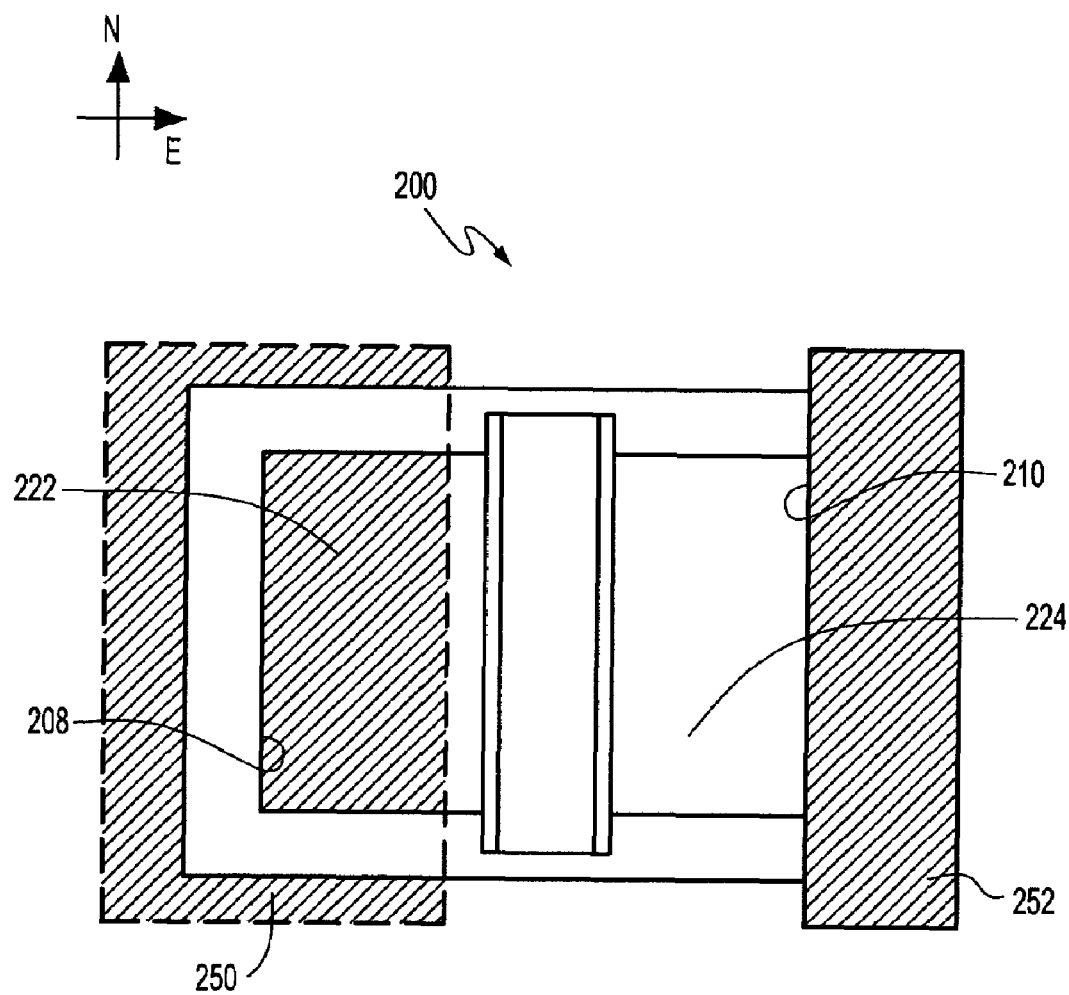
FIG. 2 is a face-up plan view of a FET in accordance with another embodiment of the invention.

FIG. 2 is a face-up plan view of a FET 200 according to a variation of the embodiment shown and described above with reference to FIGS. 1A and 1B. With respect to FET 200, the buried dielectric stressor element 250, being disposed at a location similar to and having a construction similar to the buried dielectric stressor element 152 (FIG. 1A) underlies the source region 222 of the FET 200 at a west edge 208 of the FET. In addition, a surface dielectric stressor element 252 has construction similar to and extends from a major surface of the active semiconductor region in a manner similar to the surface dielectric stressor element 150 described above with reference to FIG. 1A. Otherwise, all features of the transistor and the buried dielectric elements 250, 252 are the same or similar to those of PFET 100 shown and described above (FIGS. 1A and 1B). When the FET 200 is a PFET, the dielectric stressor elements preferably have compressive stresses. On the other hand, when the FET 200 is an NFET, the dielectric stressor elements preferably have tensile stresses.

Figure 3A:
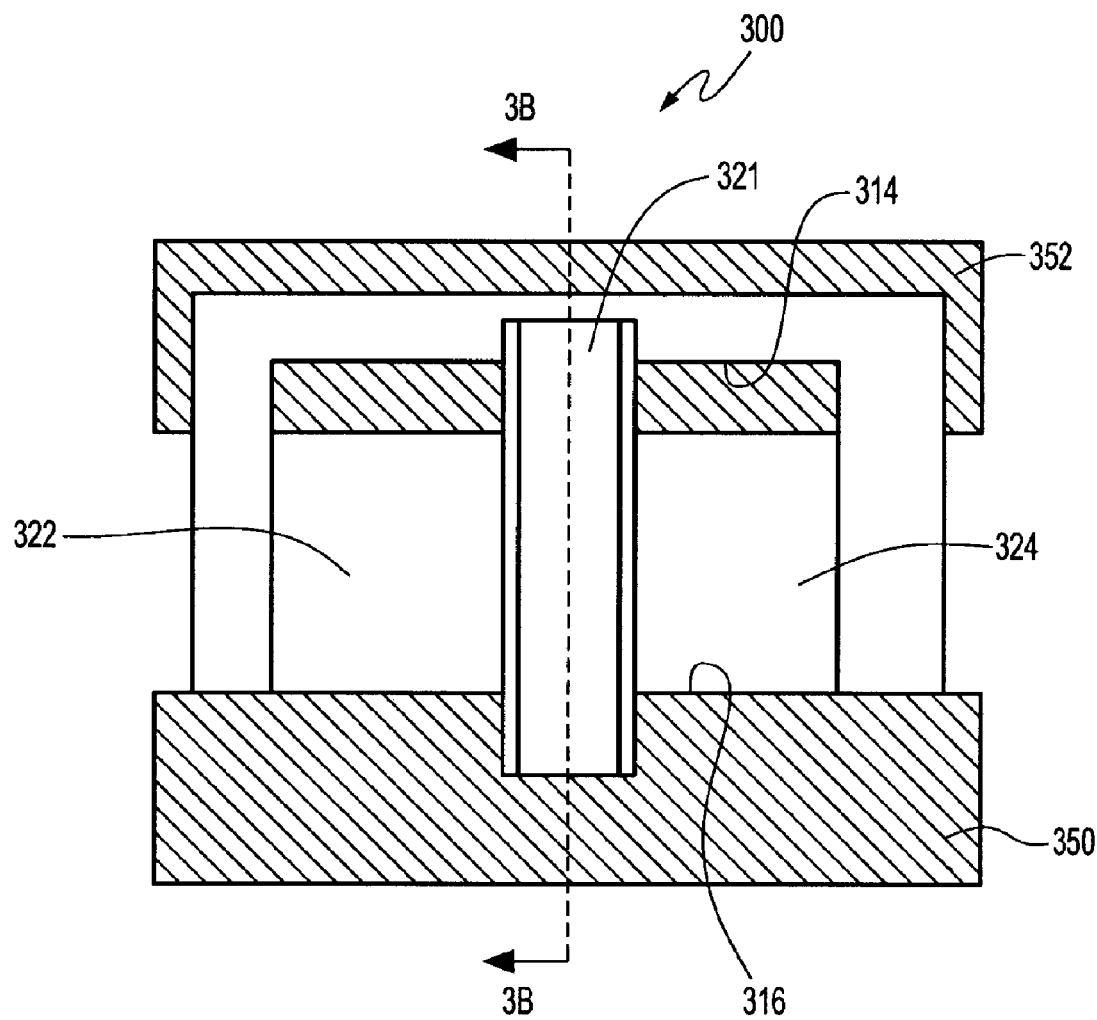
FIG. 3A is a face-up plan view of a FET in accordance with yet another embodiment of the invention.

FIG. 3A is a face-up plan view of an FET 300 according to another embodiment of the invention. The FET 300 according to this embodiment of the invention is similar to that of PFET 100 (FIGS. 1A, 1B) except as to the locations of the buried dielectric stressor element and the surface dielectric stressor element. As depicted in FIG. 3A, a buried dielectric stressor element 352 underlies a north edge 314 of the active semiconductor region and portions of the source region 322, drain region 324 and channel region (hidden from view as underlying gate conductor 321). A surface dielectric stressor element 350 is disposed at the major surface of the active semiconductor region at the south edge 316 thereof.

Figure 3B:
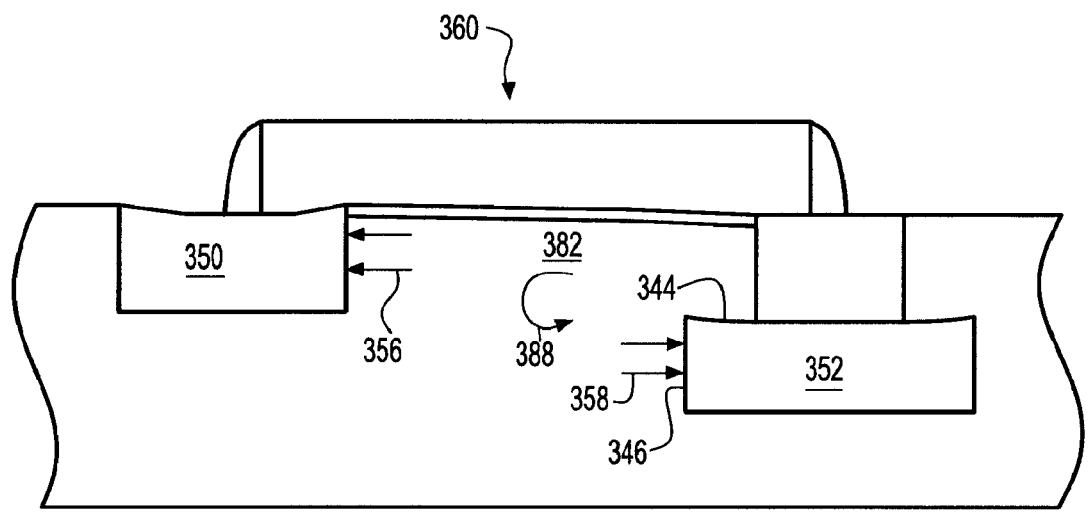
FIG. 3B is a sectional view along line 3B-3B of the FET shown in FIG. 3A.

FIG. 3B further depicts a sectional view of FET 360 through line 3B-3B of FIG. 3A. In the particular embodiment shown in FIG. 3B, the FET 360 is an NFET and the dielectric stressor elements are tensile such that they apply tensile stresses in transverse directions 356, 358 of the FET (direction of a width of the channel 382). Again, similar to that shown and described above with respect to FIG. 1C, the buried tensile dielectric stressor element 352, having both a top surface 344 and an edge 346 in contact with the active semiconductor region, applies a tensile stress in a first direction 358 to the active semiconductor region. On the other hand, a surface tensile dielectric stressor element 350 applies a tensile stress in a second direction 356 to the active semiconductor region. The stresses applied by the two dielectric stressor elements combine to apply a shear stress to the channel region 382 of the NFET, such that the channel region 382 has a tendency to "twist" in a direction as shown by arrow 388.

Figure 3C:
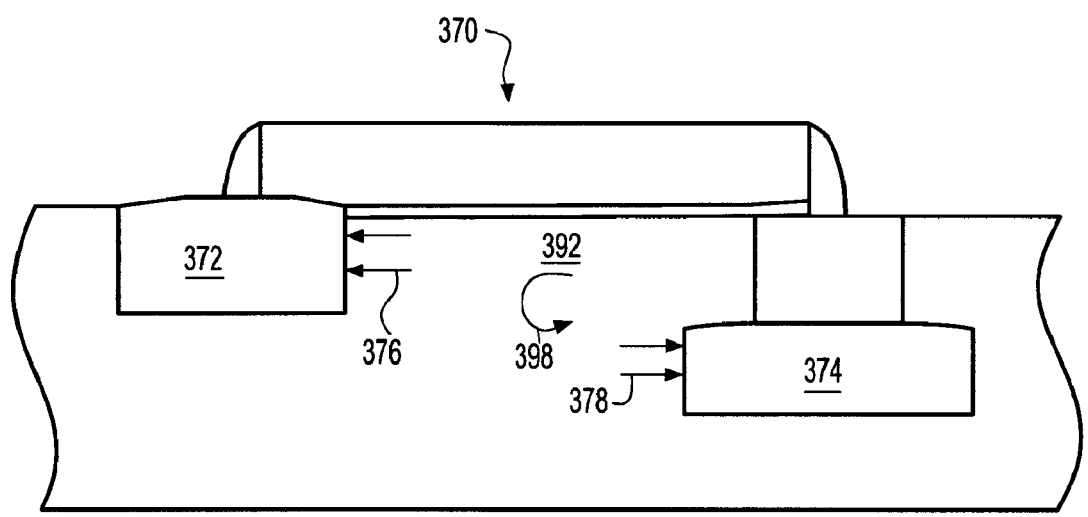
FIG. 3C is a sectional view along line 3B-3B of a variation of the FET shown in FIG. 3A.

FIG. 3C depicts a variation of the embodiment described above with respect to FIG. 3A. FIG. 3C depicts a sectional view of a PFET 370 through line 3B-3B of FIG. 3A. In the particular embodiment shown in FIG. 3C, the surface dielectric stressor element 372 and the buried dielectric stressor element 374 are compressive such that they apply compressive stresses in first and second transverse directions 376, 378 of the FET, respectively (direction of a width of the channel 392). The stresses applied by the two dielectric stressor elements combine to apply a shear stress to the channel region 392 of the PFET, such that the channel region 392 has a tendency to "twist" in a direction as shown by arrow 398.

Referring now to FIG. 4 through FIG. 7, a method will now be described for manufacturing the FET 100 described above with reference to FIGS. 1A, 1B as an example of manufacturing any of the embodiments of the invention described above. Such method utilizes a process similar to that described in commonly assigned U.S. Patent Publication No. 2005/0067294 to Choe et al. In Choe et al., a region of a silicon substrate is implanted and treated to form a buried oxide layer of a silicon-on-insulator ("SOI") substrate. A porous silicon region is formed by ion implantation of a p-type dopant (for example, Ga, Al, B and $BF_2$) and subsequent anodization. The porous silicon region is then oxidized to form the buried oxide layer.

Figure 4:
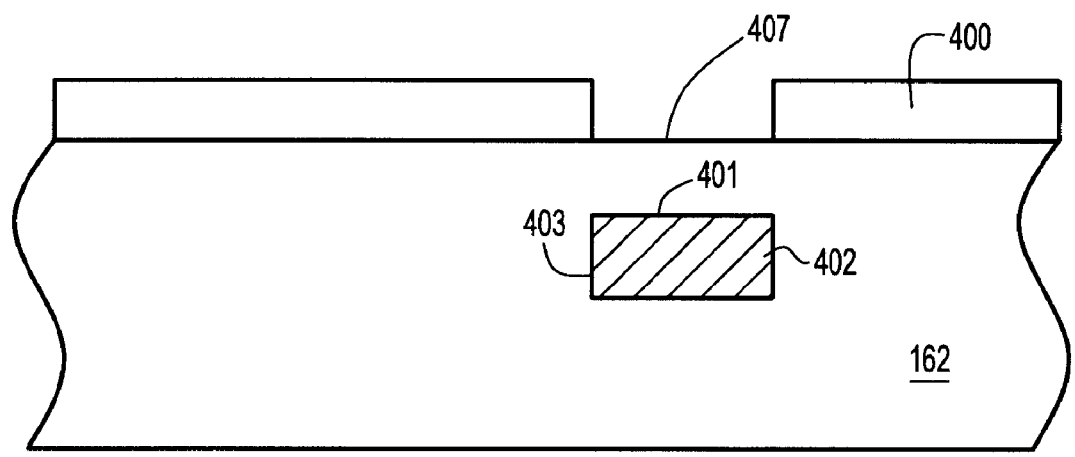
FIGS. 4 through 7 are sectional views illustrating a process of making a FET as illustrated in FIG. 1A, the particular section corresponding to line 1B-1B of FIG. 1A.

In the present process, a buried dielectric stressor element is formed at a location of a semiconductor substrate, e.g., a silicon substrate, which underlies only a portion (not all) of an active semiconductor region. FIG. 4 depicts a sectional view corresponding to line 1B-1B of FIG. 1A. As shown in FIG. 4, a masking layer 400, e.g., a photoresist is patterned, and a buried region underlying a major surface 207 of the substrate 162 is implanted with a p-type dopant to form a "pocket" p-doped region 402. As implanted, the dopant concentration in region 402 can range from about $1\times10^{19}$ $cm^{-3}$ to about $5\times10^{20}$ $cm^{-3}$ or higher. In any case, the achieved boron concentration must be significantly higher, i.e., one or more orders of magnitude higher than a normal (p-) p-type dopant concentration in the single-crystal silicon. Preferably, the dopant consists essentially of boron (B) or boron fluoride ($BF_2$), but gallium (Ga) and aluminum (Al) can be used instead. The depth to which ions are implanted into the semiconductor substrate 162 determines the thickness of the dielectric stressor element. The depth of the implant, in turn, is selected in accordance with the energy at which the implant is conducted. As this implant is performed through a photolithographically patterned masking layer, the process of implanting the region 402 defines the edge 403 of the implanted region, such edge 403 extending in a direction away from the horizontal upper surface 401 of the implanted region.

Figure 5:
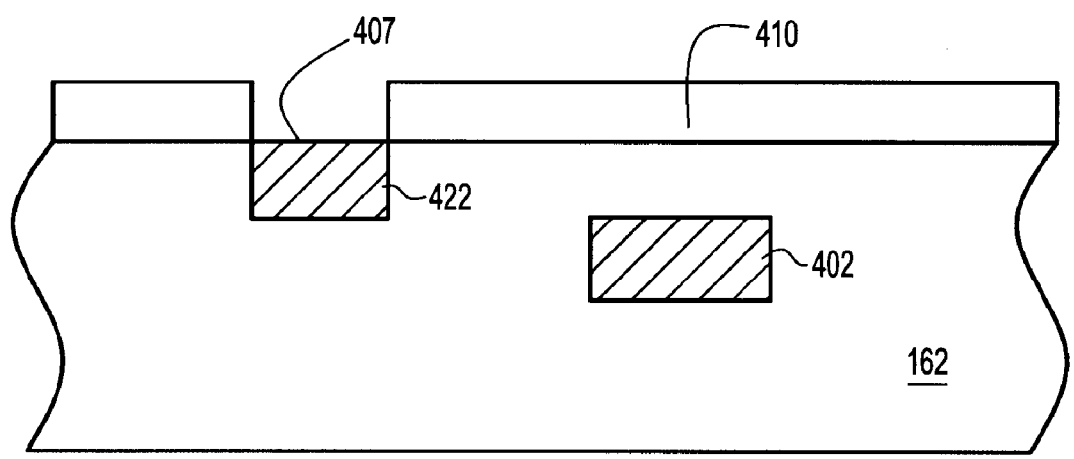

Thereafter, a surface implanted region 422 is formed at a surface location of the semiconductor substrate, extending downward into the substrate 162 from the major surface 407, as shown in FIG. 5. As depicted at this stage of the process, a second masking layer 410, e.g., a photoresist, is deposited and patterned, and the region 422 is implanted with a p-type dopant to form a surface p-doped region, using a process similar to that described above with reference to FIG. 4.

Thereafter, the second masking layer 410 is stripped and the semiconductor substrate undergoes an anodization process to convert the pocket p-doped region 402 and the surface p-doped region 422 into buried porous semiconductor regions. The pocket p-doped region 402 and the surface p-doped region become porous semiconductor regions as a result of the anodization process.

The anodization process is as follows. The semiconductor substrate 162, which preferably consists essentially of silicon and which has buried p-type implanted pocket regions is placed or preferably submerged in a bath containing a solution of hydrogen fluoride (HF), as well as a platinum electrode. The semiconductor substrate 162 is connected to a positive terminal of a current source, and the platinum electrode is connected to the negative terminal of that current source is connected in conductive communication with the current source that is connected to the positive terminal. The current source supplies an anodization current to the semiconductor substrate and the HF solution which controls the anodization process. In the presence of the anodization current, the HF solution readily diffuses through the single crystal semiconductor (silicon) to the higher concentration p-type doped pocket regions.

In those higher concentration pocket regions, the HF solution reacts with the highly doped p-type silicon to form porous silicon regions 442, 444 (FIG. 6) at locations of the implanted regions 402, 422 shown in FIG. 5. This step is performed prior to forming an additional masking layer 408 as will be described with reference to FIG. 6 below. The anodization current is in the range of 1 mA/cm$^2$ to 100 mA/cm$^2$, depending on the degree of porosity or density of the porous silicon regions 442, 444 which are to result from this process. Both the concentration of boron or other p-type dopant in the silicon and the magnitude of the anodization current can be used to control the degree of porosity. That is, these parameters control the density of the resulting porous silicon region, as measured by the mass of silicon that remains within the porous silicon regions divided by their respective volumes. For example, a low porosity region, that is, a region having a relatively high density, is one which has a density of greater than about 44% of the density of the original silicon substrate. On the other hand, a high porosity region, that is, a region having a relatively low density, is one which has a density of less than about 44% of the density of the original silicon substrate.

After anodization, the substrate is then subjected to a hydrogen bake, which removes most of the implanted boron remaining in the silicon. It is necessary to eliminate high concentrations of boron from the silicon substrate at this stage in order to avoid such high concentrations from interfering with processes used to subsequently define the differently doped regions of a transistor, i.e., the channel region, the source and drain regions, halo and/or extension regions. The hydrogen bake is conducted at temperatures ranging from about 800 degrees centigrade ("C") to 1,000 degrees C., for periods ranging from about 30 seconds to 30 minutes.

After the anodization and post-bake processes, regions 442, 444 (FIG. 6) of porous silicon remain in locations which are at least generally coextensive with the former implanted regions 402, 422. The porous silicon regions are regions which contain a multiplicity of voids. As viewed with an electron microscope, the porous silicon regions have an appearance similar to a sponge or foam material, having large numbers of voids which are supported together by connecting structure of the remaining silicon material. The degree of porosity in the porous silicon regions is determined at least in part by the initial concentration of boron within the buried pocket regions. As described above, by appropriately selecting the dose of boron that is implanted into the pocket regions and/or by controlling the amount of anodization current, it is possible to remove little mass or much greater mass of the silicon material from the buried pocket regions.

Figure 6:
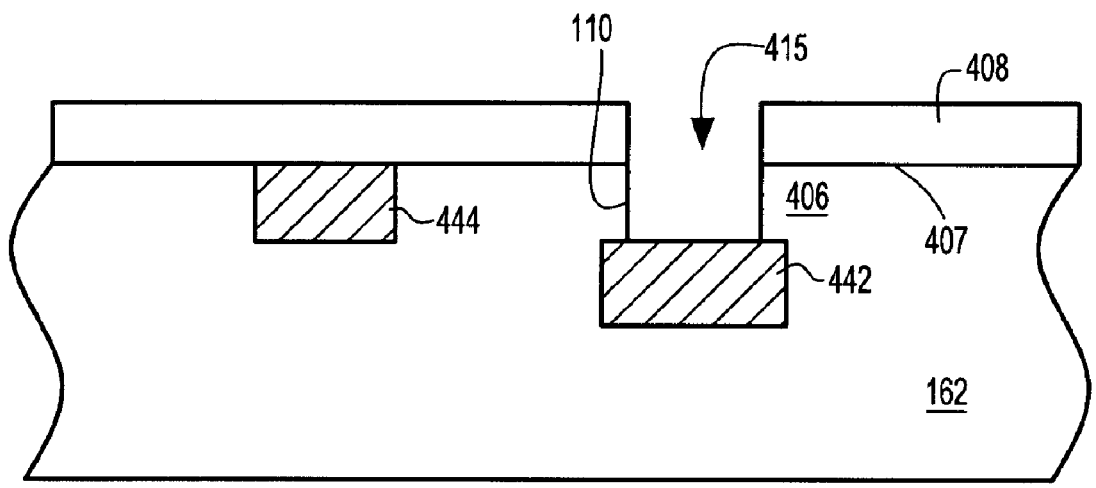

As further illustrated in FIG. 6, a further masking layer 408, e.g., a hardmask, e.g., silicon nitride, is deposited and patterned over the major surface 407 of the substrate. The substrate 162 is then patterned with this masking layer to form a trench 415 in an upper region of silicon 406 above the buried porous region 442 to define an edge 110 of the active semiconductor region. The trench 415 is etched in a location which exposes the buried porous silicon region 442.

Figure 7:
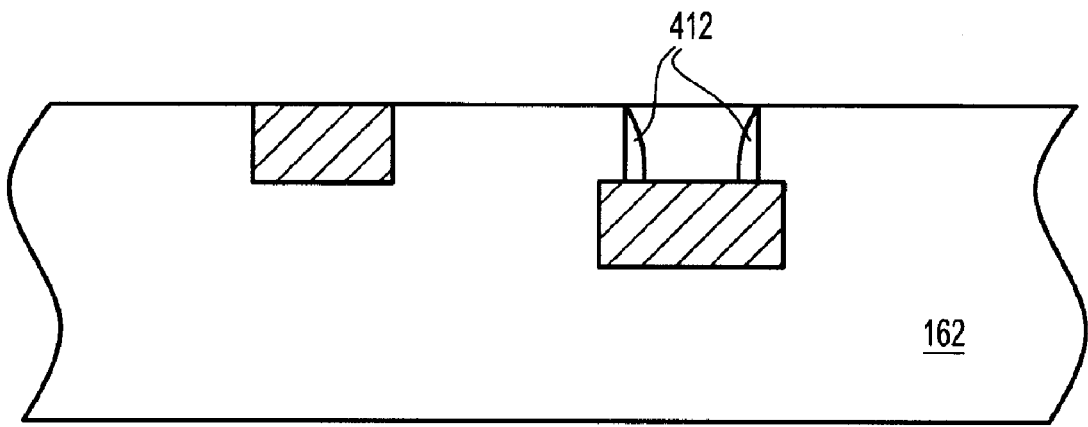

Thereafter, the masking layer 408 is stripped and edges of the active semiconductor region are protected appropriately, as by forming spacers 412 of silicon nitride thereon, as depicted in FIG. 7. Subsequent thereto, as both the buried porous silicon region and the surface porous region are now exposed from at least top surfaces thereof, both of the exposed porous silicon regions are subjected to an oxidation process which forms the dielectric stressor elements 150, 152 described above with reference to FIG. 1A.

Depending on the degree of porosity within the porous regions, the dielectric stressor elements apply a compressive stress or a tensile stress to adjacent portions of the semiconductor substrate. This result is explained as follows. The volume of silicon dioxide is greater than silicon by a ratio of 2.25:1. Thus, when the proportion of silicon that remains within each porous silicon region is greater than $\frac{1}{2.25}$ (i.e., the remaining silicon mass within the volume of the porous silicon region is greater than about 44% of the original mass), the resulting silicon dioxide expands, causing the dielectric regions to become compressively stressed when the porous regions are oxidized. Stated another way, the resulting silicon dioxide expands to become compressively stressed when the porosity is less than 56%, that is, when the amount of mass removed from the defined volume of the porous silicon region is less than 56% of the original mass.

Conversely, when the porosity is greater than 56%, the resulting silicon dioxide contracts, causing the resulting dielectric regions to become tensile stressed. As mentioned above, the degree of porosity is at least partly determined by the conditions under which the regions are implanted with boron and the conditions of the anodization process. In general, the degree of porosity is higher when the implanted boron concentration is higher, and the degree of porosity of lower when the implanted boron concentration is lower. Also, in general, higher porosity can be achieved when the current density of the anodization process is higher. Conversely, lower porosity is achieved when the current density is lower.

In the processes described in the foregoing, the edges of the implanted regions are defined lithographically. Accordingly, it follows that the extent of the porous silicon regions are determined at least in part by such lithographic processing. Hence, locations of the edges of the dielectric stressor regions that result from oxidizing the porous silicon regions are determined at least in part by the lithographic processing used to mask the substrate when implanting the dopant to form the implanted regions.

After forming the surface and buried dielectric stressor elements 150, 152 (FIG. 1A) in the above manner, the trench 415 (FIG. 7) is filled with a dielectric material such as an oxide of silicon (e.g., silicon dioxide) to form a trench isolation ("IT") regions or shallow trench isolation regions ("STI") region 106, as shown in FIG. 1A according to known prior art processing. Such prior art processing typically includes filling the trench with an oxide dielectric, performing chemical mechanical polishing ("CMP") or an etch back process to reduce the thickness of the deposited oxide to the top of the hardmask (nitride) layer, followed by stripping the remaining nitride hardmask, at the conclusion of which the structure shown in FIG. 7 results. In such process, the dielectric fill is deposited via a high density plasma ("HDP") technique and/or other chemical vapor deposition ("CVD") technique including low pressure CVD ("LPCVD"), plasma enhanced CVD ("PECVD"), etc., which may involve deposition form a tetraethylorthosilicate ("TEOS") precursor, for example. The dielectric material can include a nitride, e.g., silicon nitride which lines interior walls of the trenches, prior to deposition of the dielectric fill.

After forming the buried dielectric stressor elements, the gate conductor 121, dielectric spacers 123, and source and drain regions 122, 124, including extension regions and/or halo regions 126, 127 are formed, as shown in FIGS. 1A-1B. This completes the formation of FET 100, having the dielectric stressor elements 150, 152 as shown in the sectional view in FIG. 1A.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A chip, comprising:
    an active semiconductor region having a major surface and a thickness extending from said major surface to a first depth below said major surface;
    a field effect transistor ("FET") having a channel region, a source region and a drain region all disposed within said active semiconductor region, a length of said channel region being oriented in a longitudinal direction of said active semiconductor region, and a width of said channel region being oriented in a transverse direction of said active semiconductor region transverse to said longitudinal direction;
    a first dielectric stressor element laterally adjacent to a first edge of said active semiconductor region, said first dielectric stressor element extending from said major surface of said active semiconductor region downward to a depth not substantially greater than said first depth; and
    a second dielectric stressor element underlying only a portion of said active semiconductor region at a second edge of said active semiconductor region opposite said first edge, said second dielectric stressor element having a horizontally extending upper surface at said first depth, said second dielectric stressor element sharing an edge with said active semiconductor region, said edge extending in a direction away from said upper surface,
    said first dielectric stressor element applying a first stress to said channel region in a first direction and said second dielectric stressor element applying a second stress to said channel region in a second direction opposite to said first direction such that said first and second stresses cooperate together to apply a shear stress to said channel region.

2. The chip as claimed in claim 1, wherein said first dielectric stressor element exerts a compressive stress in said first direction, and said second dielectric stressor element exerts a compressive stress in said second direction.

3. The chip as claimed in claim 1, wherein said first dielectric stressor element exerts a tensile stress in said first direction, and said second dielectric stressor element exerts a tensile stress in said second direction.

4. The chip as claimed in claim 1, wherein said active semiconductor region has a west edge and an east edge remote from said west edge in a longitudinal direction of said active semiconductor region, and said active semiconductor region has a north edge and a south edge remote said north edge in a transverse direction of said active semiconductor region, said second dielectric stressor element contacting a trench isolation region, said trench isolation region sharing at least one of said north edge, said east edge, said south edge and said west edge with said active semiconductor region.

5. The chip as claimed in claim 1, wherein said edge of said second dielectric stressor element extends in a direction away from said upper surface of said second dielectric stressor element.

6. The chip as claimed in claim 4, wherein said FET further includes a gate conductor having a conductive portion overlying said channel region, said conductive portion having a first vertically oriented gate edge and a second vertically oriented gate edge opposite said first gate edge, wherein said edge of said second dielectric stressor element is disposed about half a distance between an edge of said trench isolation region and said second gate edge.

7. The chip as claimed in claim 4, wherein each of said north, south and east edges of said active semiconductor region are shared with said trench isolation region, said second dielectric stressor element contacts substantially less than entire lengths of said north edge and said south edge and said first dielectric stressor element functions to isolate said west edge of said active semiconductor region.

8. A chip, comprising:
    an active semiconductor region having a west edge, an east edge, a north edge and a south edge, said active semiconductor region having a longitudinal direction in a direction between said west and east edges and a transverse direction in a direction between said north and south edges, said active semiconductor region having a major surface and a thickness extending from said major surface to a first depth below said major surface,
    a field effect transistor ("FET") having a channel region, a source region and a drain region all disposed within said active semiconductor region, a length of said channel region being disposed in said longitudinal direction, and a width of said channel region being disposed in said transverse direction;
    a first dielectric stressor element disposed laterally adjacent to a first edge of said active semiconductor region, said first edge including at least one of said north edge, south edge, east edge or west edge, said first dielectric stressor element extending downward from said major surface of said active semiconductor region to a depth not substantially greater than said first depth; and
    a second dielectric stressor element underlying a second edge including at least one of said north, south, east or west edges of said active semiconductor region, said second edge being remote from said first edge, said second dielectric stressor element having a horizontally extending upper surface at said first depth, said second dielectric stressor element sharing a third edge with said active semiconductor region, said third edge extending in a direction away from said upper surface, said first dielectric stressor element applying a first stress to said channel region in a first direction and said second dielectric stressor element applying a second stress to said channel region in a second direction opposite to said first direction, such that said first and second stresses cooperate together to apply a shear stress to said channel region.

9. The chip as claimed in claim 8, wherein said first dielectric stressor element exerts a tensile stress in said first direction, and said second dielectric stressor element exerts a tensile stress in said second direction.

10. The chip as claimed in claim 9, wherein said first dielectric stressor element exerts a compressive stress in said first direction, and said second dielectric stressor element exerts a compressive stress in said second direction.

* * * * *